US005934197A

United States Patent [19]

Goulet

[11] Patent Number: 5,934,197

[45] Date of Patent: Aug. 10, 1999

[54] LITHOGRAPHIC PRINTING PLATE AND METHOD FOR MANUFACTURING THE SAME

[75] Inventor: Ronald G. Goulet, Hebron, Conn.

[73] Assignee: Gerber Systems Corporation, South Windsor, Conn.

[21] Appl. No.: 08/868,004

[22] Filed: Jun. 3, 1997

[51] Int. Cl.[6] ................................ B41C 1/10; G03F 7/26

[52] U.S. Cl. .......................... 101/467; 101/456; 101/457; 101/466; 430/302; 430/309; 430/945

[58] Field of Search .................................... 101/456, 457, 101/462, 465, 466, 467; 430/302, 303, 309, 310, 327, 945

[56] References Cited

U.S. PATENT DOCUMENTS

| | | | |
|---|---|---|---|
| 3,314,073 | 4/1967 | Becker | 347/224 |
| 3,639,124 | 2/1972 | Groncki | 430/302 |
| 3,650,742 | 3/1972 | Etter et al. | 101/467 |
| 3,832,948 | 9/1974 | Barker | 101/401.1 |
| 3,836,709 | 9/1974 | Hutchison | 101/467 |
| 4,020,762 | 5/1977 | Peterson | 101/467 |
| 4,054,094 | 10/1977 | Caddell et al. | 101/467 |
| 4,064,312 | 12/1977 | Crystal | 428/447 |
| 4,655,136 | 4/1987 | Reiss et al. | 101/459 |
| 5,148,746 | 9/1992 | Fuller et al. | 101/425 |
| 5,259,311 | 11/1993 | McCaughey, Jr. | 101/401.1 |
| 5,351,617 | 10/1994 | Williams et al. | 101/467 |
| 5,372,915 | 12/1994 | Haley et al. | 430/302 |
| 5,413,899 | 5/1995 | Scheler et al. | 430/326 |
| 5,417,164 | 5/1995 | Nishida et al. | 101/453 |
| 5,440,987 | 8/1995 | Williams et al. | 101/454 |
| 5,462,774 | 10/1995 | Huvey et al. | 427/555 |
| 5,484,684 | 1/1996 | Telser et al. | 430/253 |
| 5,487,338 | 1/1996 | Lewis et al. | 101/454 |
| 5,493,971 | 2/1996 | Lewis et al. | 101/454 |
| 5,569,568 | 10/1996 | DeBoer | 430/5 |
| 5,569,573 | 10/1996 | Takahashi et al. | 430/138 |
| 5,580,698 | 12/1996 | Andersen | 430/308 |
| 5,632,204 | 5/1997 | Lewis | 101/453 |
| 5,633,123 | 5/1997 | Hill et al. | 430/347 |
| 5,641,608 | 6/1997 | Grunwald et al. | 430/302 |
| 5,655,452 | 8/1997 | Blake et al. | 101/477 |

FOREIGN PATENT DOCUMENTS

| | | | |
|---|---|---|---|
| 94142 | 11/1983 | European Pat. Off. | 101/467 |
| 0 609 941 A2 | 8/1994 | European Pat. Off. . | |
| 0 628 409 A1 | 12/1994 | European Pat. Off. . | |
| 0 671 278 A2 | 9/1995 | European Pat. Off. . | |
| 197 48 711 A 1 | 5/1998 | Germany . | |
| 50-111911 | 3/1977 | Japan . | |
| 54-083445 | 7/1979 | Japan . | |
| 08318390 | 12/1996 | Japan . | |
| 2 305 251 | 4/1997 | United Kingdom . | |

*Primary Examiner*—Stephen R. Funk

*Attorney, Agent, or Firm*—McCormick, Paulding & Huber

[57] ABSTRACT

A printing plate for use in lithographic printing has a thermally responsive recording material. A plate is fabricated with a photosensitive emulsion affixed to an upper surface of an aluminum substrate. The plate is first chemically processed so that it is capable of accepting ink (i.e., oleophilic). Thereafter, selected areas of the emulsion are thermally removed, preferably by exposure to a high power laser beam. The plate is ready for immersion into an aqueous ink solution.

9 Claims, 4 Drawing Sheets

LITHOGRAPHIC PRINTING PLATE AND METHOD FOR MANUFACTURING THE SAME

TECHNICAL FIELD

The present invention relates to a printing plate and method of manufacturing the same that has a thermally responsive recording material for use in lithographic printing, and more particularly to a method for imaging the recording material by means of a high-powered laser.

BACKGROUND OF THE INVENTION

Lithographic printing is a form of printing which uses specially prepared printing surfaces that have regions which are capable of accepting ink (i.e., oleophilic) surrounded by background areas which are oleophobic in that they do not accept ink. Today there are two commercial methods of preparing the printing surfaces referred to as dry and wet processes, respectively. In both processes the printing surfaces are formed on plates.

Certain lithographic printing plates are used in a dry process called dryographic printing. These plates have highly ink repellent areas formed by a silicon layer and other areas which are highly absorbent of ink. A second, more commonly used process employs a wet printing plate where both water and/or an aqueous dampening liquid as well as a greasy ink are applied to the plate surface that contains the hydrophilic and hydrophobic areas. Those areas which are water attractive will soak the water or the dampening liquid and thereby be rendered oleophobic. In contrast, the hydrophobic areas repel the water but accept the ink.

There are several examples of known prior art processes by which a photo-responsive material can be made image-wise receptive or repellent to ink upon exposure. These include the processes set forth in U.S. Pat. No. 5,401,611 and U.S. Pat. No. 4,034,183. In general, these optical or photographic processes employ a substance which will either be rendered oleophilic or oleophobic upon exposure to light. The '611 method employs steps of an image-wise exposure to actinic radiation by a heat mode recording material. The material has a support having a hydrophilic surface or is provided with a hydrophilic layer and a metallic layer. On top of these layers is a hydrophobic layer having a thickness of less than 50 nanometers, thereby rendering the exposed areas hydrophilic and repellent to greasy ink. The '611 recording material is characterized by a hydrophobizing agent that has a specific chemical formula.

The '183 recording material is also heat sensitive and has a hydrophilic layer that sits on an anodized aluminum support. The '183 heat mode recording material is selectively exposed using a laser and the exposed areas are thereby rendered hydrophobic, and thus ink is accepted by the material.

SUMMARY OF INVENTION

An object of the present invention is to provide a method of exposing a thermally sensitive lithographic recording material which can be handled in ordinary daylight without risk of damage to the plate.

Another object of the present invention is to provide a method of the foregoing type which provides for better aspect ratios of features formed in the recording material.

Still another aspect of the present invention is to provide a method of the foregoing type which significantly reduces the amount of silver halide which is processed and must be disposed of in the lithographic process.

According to the present invention, a method of fabricating a recording material having an emulsion prepared on a planar substrate for use in a lithographic printing process, includes the steps of chemically processing the recording material to render all of said emulsion capable of accepting ink (i.e., oleophilic) and thermally removing the emulsion only from selected areas of the recording material to expose the substrate.

According to another aspect of the present invention, an article made in accordance with a present method of fabricating a recording material includes the steps of preparing an emulsion on a planar substrate; chemically processing the recording material to render all of said emulsion capable of accepting ink (i.e., oleophilic) and thermally removing said emulsion only from selected areas of the recording material to expose the substrate.

DESCRIPTION OF THE BEST MODE EMBODIMENT

Figure 1:
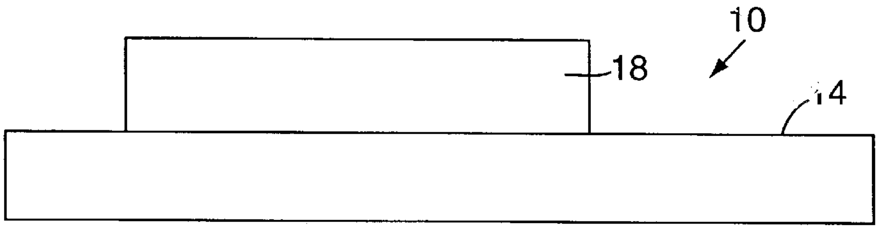
FIG. 1 PRIOR ART
FIG. 1 is a simplified schematic illustration showing the emulsion placed on an aluminum substrate as part of a recording medium used in a prior art lithographic printing process.

Referring now to FIG. 1 there is shown in a simplified schematic illustration a recording medium 10 of a type known in the lithographic art. The medium is comprised of a photosensitive emulsion layer 12 formed on an aluminum substrate 14. In the prior art processes, an unexposed photosensitive emulsion is prepared, transported and otherwise handled in a safe-light condition away from exposure to room light. Consequently, all of the usual procedures and safeguards against unwanted exposure burden the prior art lithographic processes. This is true for both virgin plates as well as those plates that have been exposed but not yet been developed.

Figure 9:
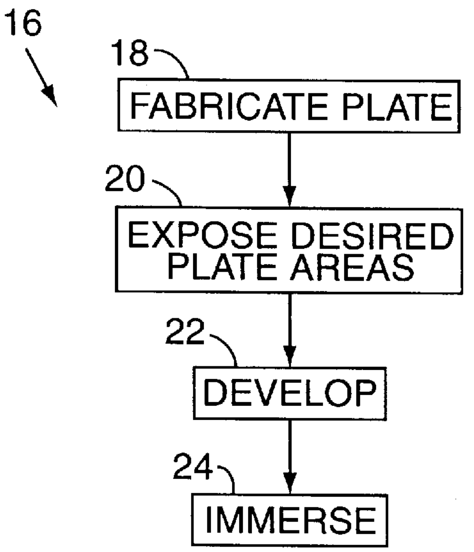
FIG. 9 PRIOR ART
FIG. 9 is a diagrammatic illustration of a prior art method of generating lithographic recording media.

A wet prior art process 16 is summarized in the diagrammatic illustration of FIG. 9. The recording medium or printing plate in the present example is fabricated at block 18. The features are formed in the plate by selected exposure at block 20. The plate is developed (block 22) and immersed in an aqueous ink solution at block 24.

Figure 2:
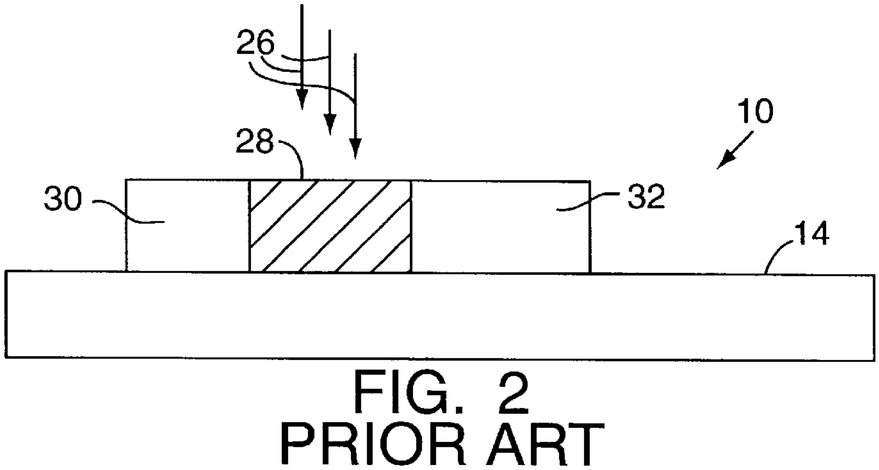
FIG. 2 PRIOR ART
FIG. 2 is a simplified schematic illustration of the recording medium of FIG. 1 receiving optical radiation during a prior art lithographic printing process.
Figure 3:
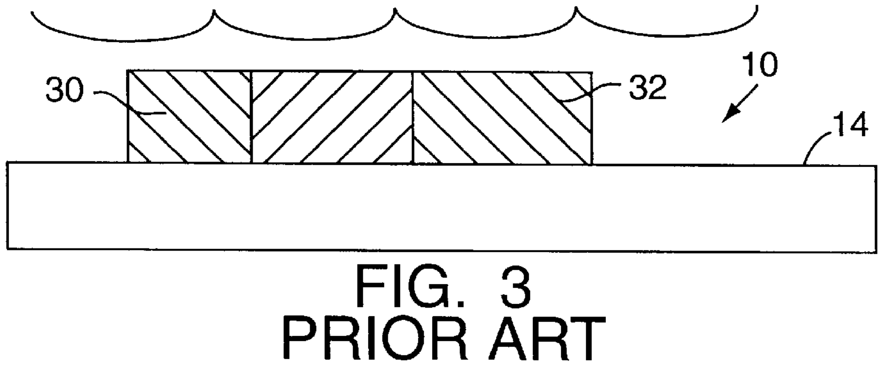
FIG. 3 PRIOR ART
FIG. 3 is a simplified schematic illustration of the recording medium of FIG. 1 during development during a prior art lithographic printing process.
Figure 4:
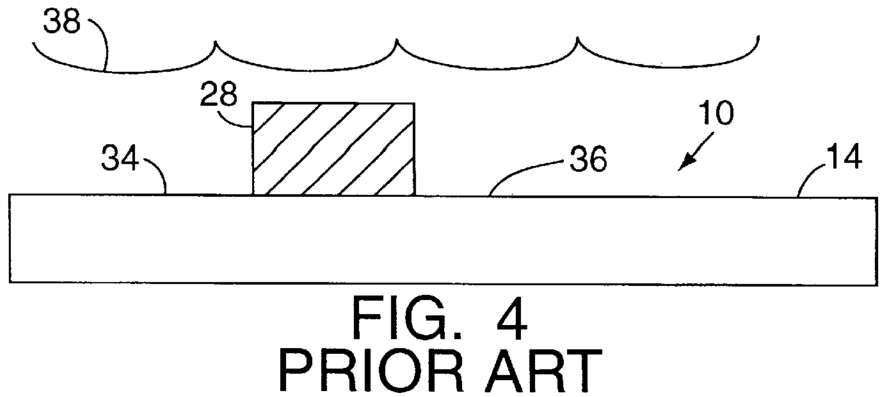
FIG. 4 PRIOR ART
FIG. 4 is a simplified schematic illustration of the radiated recording medium of FIG. 2 demonstrating an affinity for printing ink in selected regions during a prior art lithographic printing process.

In simplified schematic illustration of FIG. 2, selected regions of the emulsion receive optical radiation 26, typically from an argon-ion laser. Exemplary region 28 in the figure undergoes a photochemical reaction, while adjacent regions 30, 32 do not. As demonstrated in the schematic illustration of FIG. 3, regions 30, 32 are cleared of all emulsion in a subsequent process step in which the plate is immersed in a developing solution. These regions expose corresponding surface areas 34, 36 of the aluminum substrate which become hydrophilic, and thereafter absorb water when immersed in an aqueous ink solution 38 (FIG. 4). Ink is absorbed only in region 28.

Figure 5:
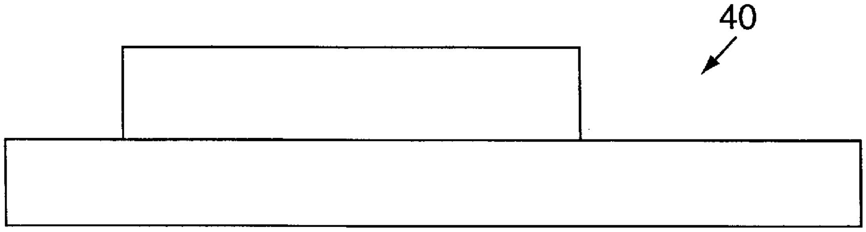
FIG. 5 is a simplified schematic illustration of a recording medium as processed by the present method comprised of an emulsion placed on an aluminum substrate.

Referring now to FIG. 5, there is a simplified schematic illustration of a recording medium which can be a normal, SDB Du Pont Howsen plate 40 in the preferred embodiment. The plate is of the type that is normally exposed as shown in FIG. 2 by radiation from an argon ion laser and then chemically developed to remove the unexposed regions of the emulsion in the manner detailed hereinabove.

Figure 10:
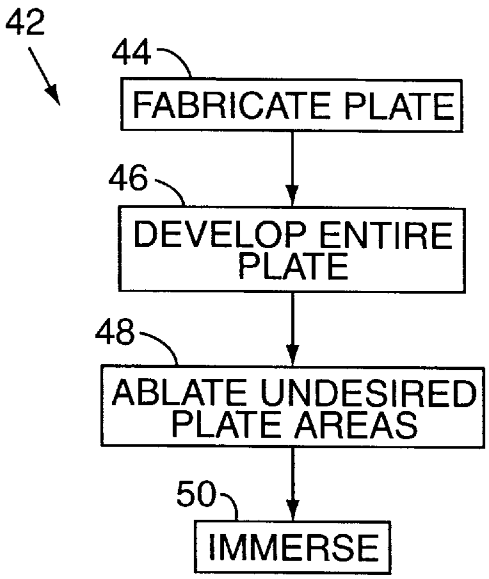
FIG. 10 is a diagrammatic illustration of a method of generating lithographic recording media as provided in accordance with the present invention.

FIG. 10 is a diagrammatic illustration of a process 42 provided in accordance with the present invention. After the plate is fabricated (block 44) the entire surface is developed (block 46). The undesired areas are ablated by a high power laser (block 48) before the plate is immersed (block 50) in an aqueous ink solution.

Figure 6:
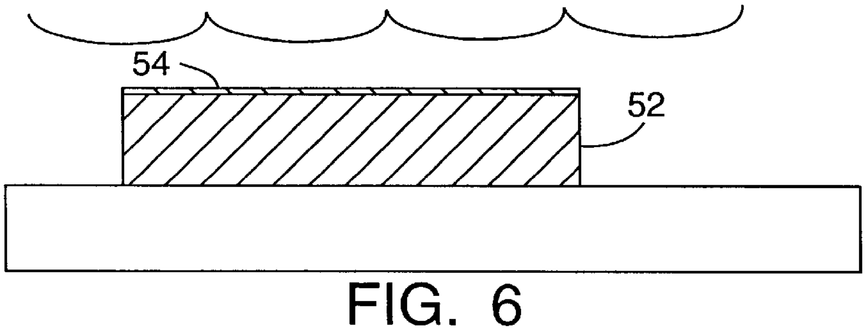
FIG. 6 is a simplified schematic illustration of the recording medium of FIG. 5 during development.

With the present invention as shown in FIG. 6 however, the entire surface 52 of the plate 40 is completely chemically processed as described hereinabove with respect to FIG. 3, leaving behind an all black area 54 with no aluminum exposed. This exposed area will be featureless in that any subsequent immersion in an aqueous ink solution would result in ink absorption across the surface, with no absorption of water by aluminum.

Figure 7:
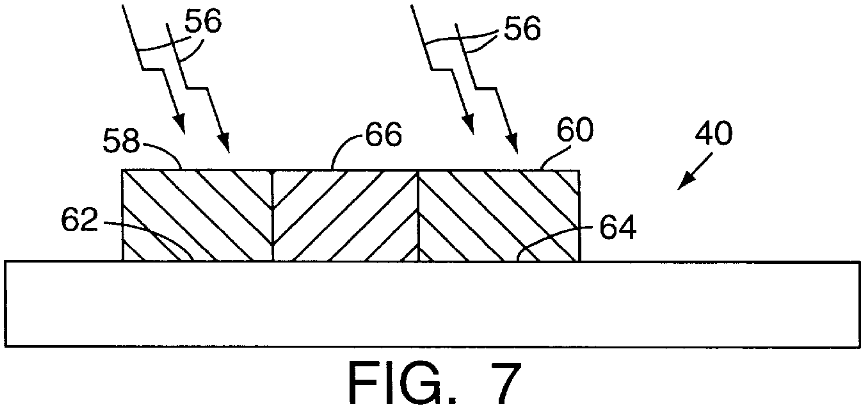
FIG. 7 is a simplified schematic illustration of the exposed recording medium of FIG. 5 during thermal ablation.

With the present method, the features in the plate are formed by laser energy delivered at a level great enough to remove selected areas of the processed emulsion. Referring now to FIG. 7, there is shown schematically the plate 40 of FIG. 5 being exposed to high powered laser radiation 56. Material is removed from the surface by ablation in those areas 58,60 which are to be outside of the feature, thereby exposing surface regions 62, 64 of the aluminum layer which lies below. In the preferred embodiment, the ablation step is accomplished by a high power laser such as found in the Gerber C42T imager system. With the present method as with the prior art processes, the exposed hydrophilic surface regions 62, 64 absorb water rendering them oleophobic, and the unexposed areas such as region 66 are rendered oleophilic. The presence of a vacuum is quite helpful in removing debris in the region where emulsion is being ablated.

The recording medium processed in the present invention can then be brought to a commercial printer where it can be mounted in a normal matter and an image can be printed from the plate. The present method provides an image which has the same characteristics as a thermal plate processed in a known way, but the images of each feature are much sharper and have much higher edge details due in part to better aspect ratios of the edges of each individual feature. Those skilled in the art will note that other methods of thermally removing the emulsion are contemplated by the present invention other than by direct laser radiation, including those which provide sufficient power to free the emulsion from the substrate.

The present invention allows for recording medium, and specifically Dupont SDB plates, to be prepared at the factory including the steps of development prior to shipment to the customer. Plates processed in accordance with the present invention are daylight safe, requiring none of the safeguards that plates processed by known methods must employ. Consequently, the present invention lowers costs of production of lithographic plates, both from the perspective of individual plate processing, as well as by reducing losses associated with defective handling of light sensitive plates.

When exposed in the thermal plate setter, the images are much improved over the original characteristics of those plates prepared in the prior art manner. A point of departure of the present invention over the prior art is the amount of silver which would have to be disposed of, the present invention contemplates slightly longer run lengths in certain commercial plates with the only drawback presently being the amount of energy which is required to expose the plates based on the current usage of standard commercial lithographic plates. Naturally, those skilled in the art will note that the specific parameters of the present invention can be optimized to reduce any excessive power requirements.

Figure 8:
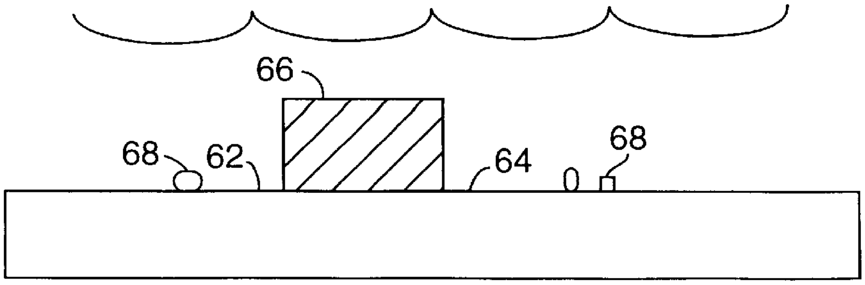
FIG. 8 is a simplified schematic illustration of the recording medium in FIG. 6 after ablation, leaving the ink receptive region intact, and thereafter, being washed.

The present invention contemplates an additional step to maximize the image quality and is shown schematically in FIG. 8. Although an image is formed by the steps noted above, a small amount of debris 68 is left behind in the areas where the emulsion was ablated by the laser beam. Consequently, the partially exposed recording medium is washed and gummed. This step removes all of the debris, clearing the aluminum for better absorption of water.

Figure 11:
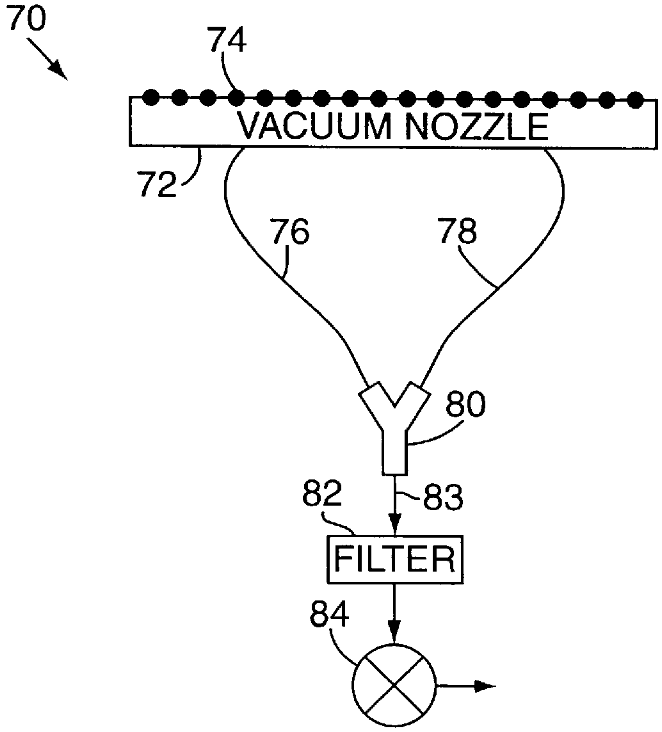
FIG. 11 is a simplified schematic illustration of a debris removal system provided by the presention invention.

Referring now to FIG. 11, there is shown a simplified schematic illustration of a debris removal apparatus 70 provided in accordance with the present invention. The debris removal apparatus includes a vacuum nozzle 72 having a plurality of holes 74 which are spaced apart to allow for presentation of the vacuum to the media plate surface. Two hoses 76, 78 are provided in the preferred embodiment to evacuate the vacuum nozzle. These hoses are joined at a Y union 80 for presentation to a hose 83. The debris is passed to a filter 82, preferably having a 0.3 micron pore size, and ultimately to a vacuum pump 84. The nozzle hoses are preferably three quarter inch in outside diameter, and the hose to the filter preferably has one and one quarter inches OD, as are the remaining hoses which connect the other various elements. The vacuum pump in the preferred embodiment can evacuate 60 cubic feet per minute. The debris is exhausted from the system into an exhaust tube in the preferred embodiment.

Figure 12:
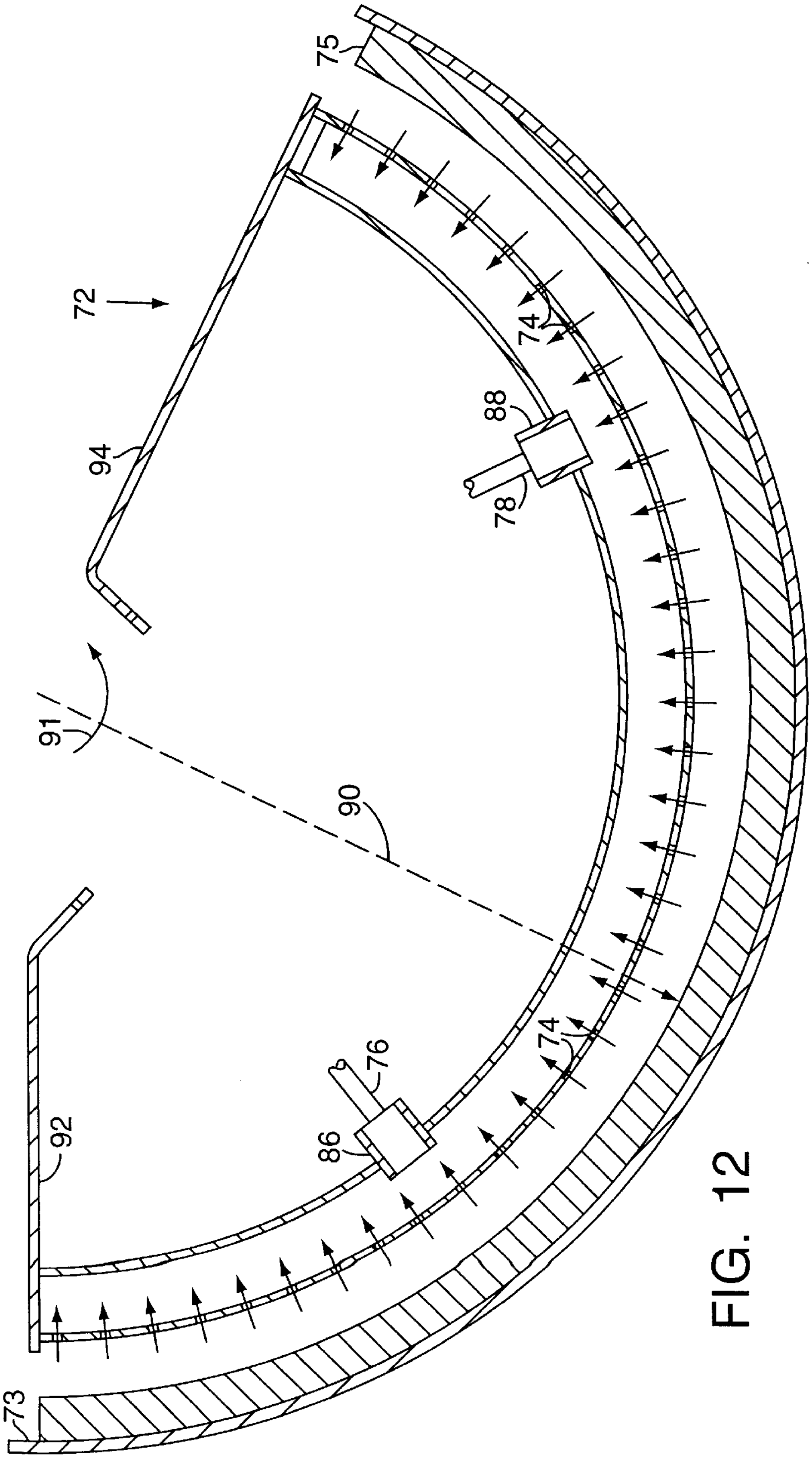
FIG. 12 is a simplified view, in section, of a nozzle used with the debris removal system of FIG. 11.

FIG. 12 contains a more detailed section illustration of the portion of the vacuum nozzle 72. The vacuum nozzle is preferably tubular in shape and curved along its longitudinal axis to substantially conform to the curved surface 73 of a drum which receives a printing plate 75. The drum is of the type described in U.S. patent applications Nos. 08/674,439 and 08/674,763 respectively entitled "Apparatus and Method For Positioning A Lens To Expand An Optical Beam Of An Imaging System" and "Magnetically Preloaded Air Bearing Motion System For An Imaging Device", each of which is incorporated herein by reference. The nozzle material is preferably made from an aluminum alloy (6061-t6) drawn tubing , having a ¼ inch OD with a 0.65 inch wall thickness. The vacuum hoses are received at nozzle ports 86, 88 which preferably have an adapter fitting for a threaded connection to the vacuum hose.

The vacuum nozzle is characterized by the plurality of openings 74 which are spaced along the outer wall of the tubular nozzle at approximately 30 degrees to the horizontal. The holes are configured about the surface which is to be most adjacent to an exposure beam 90 as it is swept across the plate in a fast scan direction 91. As the plate is received on the curved drum surface, the nozzle will be curved as well. The angular extent of the nozzle is substantially co-extensive with the sweep of the scan beam in the fast scan direction. In other imaging systems, the nozzle geometry will be adapted to that of the plate to ensure close proximitry thereto.

The apparatus further comprises mounting brackets 92, 94 which are welded on to distal ends of the nozzle. The brackets themselves are adapted to be received by a carriage, not shown and not part of the present invention. In the preferred embodiment, the brackets are affixed to the carriage by the use of shock-absorbing rubber mounts (also not shown) of a conventional type. The nozzle, therefore, will move with the carriage in the slow scan direction. In the preferred embodiment, the nozzle outer surface is spaced approximately 3/16 inch from the plate surface.

Similarly, although the invention has been shown and described with respect to a preferred embodiment thereof, it would be understood by those skilled in the art that other various changes omissions and additions thereto may be made without departing from the spirit and scope of the present invention.

I claim:

1. A method of fabricating a recording material having an oleophilic emulsion prepared on a planar substrate for use in a lithographic printing process, the method comprising the steps of:

exposing all of the emulsion to optical radiation;

developing all of the emulsion so as to render all of said emulsion capable of accepting ink; and thermally removing said emulsion only from selected areas of the recording material to reveal the substrate.

2. The method of claim 1 wherein said thermal removal step further comprises the step of exposing selected areas of said emulsion to optical power at a level great enough to ablate said emulsion from said substrate only in said selected emulsion areas.

3. The method of claim 2 further comprising the step of applying an aqueous ink solution to said processed and ablated recording material.

4. The method of claim 2 further comprising the step of washing the recording material after said ablation step to remove any residual emulsion from said selected areas.

5. The method of claim 2 further comprising the step of applying a vacuum to pick up ablated emulsion during said step of thermally removing said emulsion.

6. An article made in accordance with a method of fabricating a recording material comprising the steps of:

preparing an emulsion on a planar substrate;

exposing all of the emulsion to optical radiation;

developing all of the emulsion so as to render all of said emulsion capable of accepting ink; and thermally removing said emulsion only from selected areas of the recording material to reveal the substrate.

7. The article of claim 6 wherein said thermal removal step further comprises the step of exposing selected areas of said emulsion to optical power at a level great enough to ablate said emulsion from said substrate only in said selected emulsion areas.

8. The article of claim 6 wherein the method further comprises the step of applying an aqueous ink solution to said processed and ablated recording material.

9. The article of claim 6 wherein said substrate comprises aluminum.

* * * * *